(12) United States Patent
Cheng

(10) Patent No.: US 6,384,340 B1
(45) Date of Patent: *May 7, 2002

(54) MULTI-LAYER CIRCUIT BOARD

(75) Inventor: Yu-Chiang Cheng, Taipei (TW)

(73) Assignee: Mitac International Corp., Hsinchu Hsien (TW)

( * ) Notice: Subject to any disclaimer, the term of this patent is extended or adjusted under 35 U.S.C. 154(b) by 0 days.

This patent is subject to a terminal disclaimer.

(21) Appl. No.: 09/800,408

(22) Filed: Mar. 6, 2001

(51) Int. Cl.[7] .................................................. H05K 1/03
(52) U.S. Cl. ....................................... 174/255; 361/792
(58) Field of Search .................................. 174/255, 261, 174/262; 361/792, 793, 794, 795; 257/700

(56) References Cited

U.S. PATENT DOCUMENTS

| | | | | |
|---|---|---|---|---|
| 3,798,762 A | * | 3/1974 | Harris et al. .................... 29/626 |
| 4,285,780 A | * | 8/1981 | Schachter ..................... 204/15 |
| 4,526,835 A | * | 7/1985 | Takahashi et al. ........... 428/413 |
| 4,675,789 A | * | 6/1987 | Kuwabara et al. ........... 174/262 |
| 4,830,704 A | * | 5/1989 | Voss et al. .................... 156/629 |
| 5,010,641 A | * | 4/1991 | Sisler ............................. 29/830 |
| 5,400,039 A | * | 3/1995 | Araki et al. ................. 343/760 |
| 5,719,750 A | * | 2/1998 | Iwane .......................... 361/794 |
| 5,796,587 A | * | 8/1998 | Lauffer et al. ............... 361/763 |
| 5,840,382 A | * | 11/1998 | Nishide et al. .............. 428/209 |
| 6,191,475 B1 | * | 2/2001 | Skinner et al. .............. 257/700 |
| 6,229,095 B1 | * | 5/2001 | Kobayashi ................... 174/255 |
| 6,261,467 B1 | * | 7/2001 | Giri et al. ...................... 216/13 |

* cited by examiner

*Primary Examiner*—Kamand Cuneo
*Assistant Examiner*—José H. Alcala
(74) *Attorney, Agent, or Firm*—Merchant & Gould P.C.

(57) ABSTRACT

A multi-layer circuit board includes first, second, third, fourth and fifth insulating substrates, first, second, third and fourth signal wiring layers, a ground wiring layer, and a power wiring layer. The insulating substrates and the wiring layers are press-bonded to each other to form the circuit board with a thickness of about 1.2 mm. Each of the first and fifth insulating substrates has a thickness ranging from 4.175 to 4.725 mil. Each of the second and fourth insulating substrates has a thickness ranging from 5.7 to 6.3 mil. The third insulating substrate has a thickness ranging to 16.8 mil.

10 Claims, 2 Drawing Sheets

MULTI-LAYER CIRCUIT BOARD

BACKGROUND OF THE INVENTION

1. Field of the Invention

The invention relates to a multi-layer circuit board, more particularly to a multi-layer circuit board with a thickness of 1.2 mm, which can achieve impedance matching to result in reduced high speed signal reflection and reduced electromagnetic interference.

2. Description of the Related Art

FIG. 1 shows a conventional multi-layer circuit board with a thickness of about 1.2 mm. As shown, the conventional 1.2-mm multi-layer circuit board includes: first, second, third, fourth and fifth insulating substrates (C1), (C2), (C3), (C4) and (C5) disposed sequentially one above the other; a first signal wiring layer (Si) disposed on one side of the first insulating substrate (C1) opposite to the second insulating substrate (C2); a ground wiring layer (GND) disposed between the first and second insulating substrates (C1), (C2); a second signal wiring layer (S2) disposed between the second and third insulating substrates (C2), (C3); a third signal wiring layer (S3) disposed between the third and fourth insulating substrates (C3), (C4); a power wiring layer (PWR) disposed between the fourth and fifth insulating substrates (C4), (C5); and a fourth signal wiring layer (S4) disposed on one side of the fifth insulating substrate (C5) opposite to the fourth insulating substrate (C4). The first, second, third, fourth and fifth insulating substrates (C1), (C2), (C3), (C4) and (C5), the first, second, third and fourth signal wiring layers (S1), (S2), (S3), (S4), the ground wiring layer (GND) and the power wiring layer (PWR) are press-bonded to each other to form the conventional circuit board with a thickness of about 1.2 mm. The first and fourth wiring layers (S1), (S4) are adapted to be mounted with components 10 thereon. The third insulating substrate (C3) has a thickness of about 8 mil. Both of the second and fourth insulating substrates (C2), (C4) have a thickness of about 6 mil. Both of the first and fifth insulating substrates (C1), (C5) have a thickness of about 8 mil. Each of the first, third and fifth insulating substrates (C1), (C3), (C5) is made from a polyester prepreg. Each of the second and fourth insulating substrates (C2), (C4) is made from a fibrous core material that contains paper or glass fibers. In this structure, the first wiring layer (S1) has a first resistance (Rs1) with respect to the ground wiring layer (GND). The second wiring layer (S2) has a second resistance (Rs2) with respect to the ground wiring layer (GND) and the power wiring layer (PWR). The third wiring layer (S3) has a third resistance (Rs3) with respect to the ground wiring layer (GND) and the power wiring layer (PWR). The fourth wiring layer (S4) has a fourth resistance (Rs4) with respect to the power wiring layer (PWR). The first and fourth resistances (Rs1), (Rs4) are about 71 ohms. The second and third resistances (Rs2), (Rs3) are about 46 ohms. During layout, electrical connections pass through the wiring layers and the insulating substrates. Such a conventional circuit board structure has certain drawbacks, which are set forth as follows:

(1) Serious reflection during high speed signal transmission: According to the standard theoretical values determined by Intel, the resistance between two adjacent wiring layers for a circuit board during high speed signal transmission is preferably within the range of 55±10%Ω, i.e., between 49.5Ω and 60.5Ω. However, the resistances of the conventional circuit board fall outside the preferable range recommended by Intel. In addition, there is a difference of 25 ohms between the value of the first and fourth resistances (Rs1), (Rs4) and that of the second and third resistances (Rs2), (Rs3). Such a large difference will result in an impedance mismatch. Thus, when a high speed signal is being transmitted through the conventional circuit board and passes from the first or fourth wiring layer (S1) or (S4) to the second or third wiring layer (S2) or (S3), reflection of the signal will result. The reflection index of the high-speed signal can be calculated as $$\rho = \frac{Zl - Zo}{Zl + Zo} = \frac{Rs1 - Rs2}{Rs1 + Rs2} = 0.21$$

When the reflection is serious, the waveform will be distorted considerably, thereby resulting in poor signal quality. In view of the aforesaid, the conventional 1.2-mm multi-layer circuit board is not suited for high speed signal transmission.

(2) Weakened magnetic flux counteraction: As reflection of high speed signals will generate standing waves, which will increase electromagnetic radiation of the high speed signal, the magnetic flux counteraction of the circuit board is weakened, thereby resulting in excessively high electromagnetic interference.

SUMMARY OF THE INVENTION

Therefore, the main object of the present invention is to provide a multi-layer circuit board with a thickness of 1.2 mm, which can achieve impedance matching to result in reduced high speed signal reflection and reduced electromagnetic interference.

Accordingly, a multi-layer circuit board of this invention includes: first, second, third, fourth and fifth insulating substrates disposed sequentially one above the other; a first signal wiring layer disposed on one side of the first insulating substrate opposite to the second insulating substrate; a ground wiring layer disposed between the first and second insulating substrates; a second signal wiring layer disposed between the second and third insulating substrates; a third signal wiring layer disposed between the third and fourth insulating substrates; a power wiring layer disposed between the fourth and fifth insulating substrates; and a fourth signal wiring layer disposed on one side of the fifth insulating substrate opposite to the fourth insulating substrate. The first, second, third, fourth and fifth insulating substrates, the first, second, third and fourth signal wiring layers, the ground wiring layer and the power wiring layer are press-bonded to each other to form the circuit board with a thickness of about 1.2 mm. Each of the first and fifth insulating substrates has a thickness ranging from 4.175 to 4.725 mil. Each of the second and fourth insulating substrates has a thickness ranging from 5.7 to 6.3 mil. The third insulating substrate has a thickness ranging from 15.2 to 16.8 mil. The first signal wiring layer has a first resistance with respect to the ground wiring layer. The second signal wiring layer has a second resistance with respect to the ground wiring layer and the power wiring layer. The third signal wiring layer has a third resistance with respect to the ground wiring layer and the power wiring layer. The fourth signal wiring layer has a fourth resistance with respect to the power wiring layer. The first, second, third and fourth resistances are within the range of 49.5 to 60.5 ohms.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
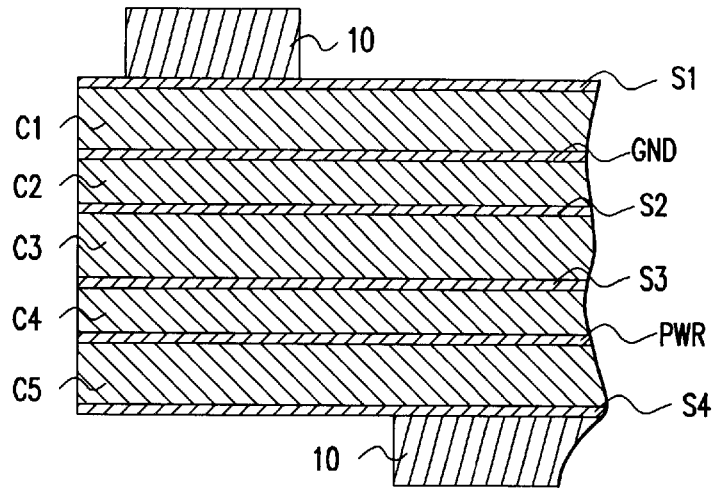
FIG. 1 is a schematic view of a conventional multi-layer circuit board with a thickness of about 1.2 mm.
Figure 2:
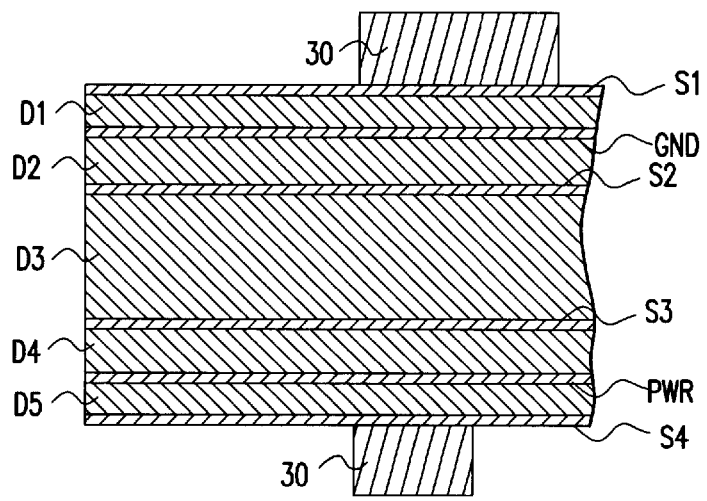
FIG. 2 is a schematic view of the preferred embodiment of a multi-layer circuit board according to the invention.
Figure 3:
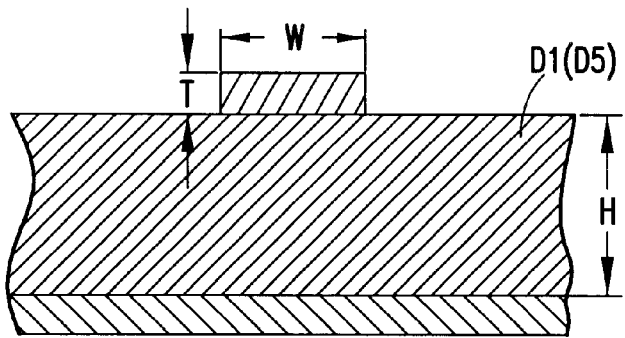
FIG. 3 is an enlarged schematic view of the preferred embodiment in part.
Figure 4:
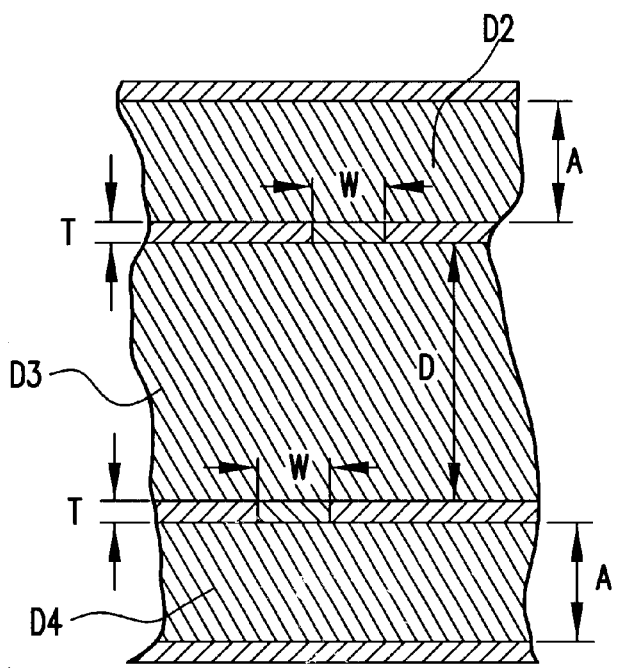
FIG. 4 is another enlarged schematic view of the preferred embodiment in part.

Referring to FIGS. 2 to 4, the preferred embodiment of a multi-layer circuit board according to the present invention is shown to include: first, second, third, fourth and fifth insulating substrates (D1), (D2), (D3), (D4), (D5) disposed sequentially one above the other; a first signal wiring layer (S1) disposed on one side of the first insulating substrate (D1) opposite to the second insulating substrate (D2); a ground wiring layer (GND) disposed between the first and second insulating substrates (D1), (D2); a second signal wiring layer (S2) disposed between the second and third insulating substrates (D2), (D3); a third signal wiring layer (S3) disposed between the third and fourth insulating substrates (D3), (D4); a power wiring layer (PWR) disposed between the fourth and fifth insulating substrates (D4), (D5); and a fourth signal wiring layer (S4) disposed on one side of the fifth insulating substrate (D5) opposite to the fourth insulating substrate (D4). The first and fourth signal wiring layers (S1), (S4) are adapted to be mounted with components 30 thereon.

The first, second, third, fourth and fifth insulating substrates (D1), (D2), (D3), (D4), (D5), the first, second, third and fourth signal wiring layers (S1), (S2), (S3), (S4), the ground wiring layer (GND) and the power wiring layer (PWR) are press-bonded to each other to form the circuit board with a thickness of about 1.2 mm. During press-bonding of the circuit board, the second and third signal wiring layers (S2), (S3) are disposed to sandwich the third insulating substrate (D3). The ground wiring layer (GND) and the second signal wiring layer (S2), and the third signal wiring layer (S3) and the power wiring layer (PWR) are disposed to sandwich the second and fourth insulating substrates (D2), (D4), respectively. Finally, the first and fourth signal wiring layers (S1), (S4) are respectively disposed to sandwich the assembly.

According to the present invention, each of the first and fifth insulating substrates (D1), (D5) has a thickness ranging from 4.175 to 4.725 mil. Each of the second and fourth insulating substrates (D2), (D4) has a thickness ranging from 5.7 to 6.3 mil. The third insulating substrate (D3) has a thickness ranging from 15.2 to 16.8 mil. The first signal wiring layer (S1) has a first resistance (Rs1) with respect to the ground wiring layer (GND). The second signal wiring layer (S2) has a second resistance (Rs2) with respect to the ground wiring layer (GND) and the power wiring layer (PWR). The third signal wiring layer (S3) has a third resistance (Rs3) with respect to the ground wiring layer (GND) and the power wiring layer (PWR) The fourth signal wiring layer (S4) has a fourth resistance (Rs4) with respect to the power wiring layer (PWR). With the thicknesses of the insulating substrates (D1), (D2), (D3), (D4), (D5) controlled to be within the aforesaid ranges, the first, second, third and fourth resistances (Rs), (Rs2), (Rs3) and (Rs4) can be kept within the range of 49.5 to 60.5 ohms. At least one of the first, third and fifth insulating substrates (D1), (D3), (D5) is made from a polyester prepreg. At least one of the second and fourth insulating substrates (D2), (D4) is made from a fibrous core material that contains paper fibers or glass fibers. In the preferred embodiment, the thickness of each of the first and fifth insulating substrates (D1), (D5) is equal to 4.5 mil, the thickness of each of the second and fourth insulating substrates (D2), (D4) is equal to 6 mil, and the thickness of the third insulating substrate (D3) is equal to 16 mil. Each of the first and fourth signal wiring layers (S1), (S4) has a thickness of about 0.7 mil. Each of the second and third signal wiring layers (S2), (S3), the ground wiring layer (GND) and the power wiring layer (PWR) has a thickness of about 1.4 mil. In addition, the first, second, third and fourth resistances (Rs1), (Rs2), (Rs3) and (Rs4) are desired to be substantially equal.

The approximate thickness of each of the insulating substrates (D1), (D2), (D3), (D4), (D5) is calculated in the manner set forth as follows:

Formula I (for obtaining the resistance values of (Rs1) and (Rs4))

$$Zo1 = \frac{87}{\sqrt{E_R + 1.41}} \ln\left(\frac{5.98H}{0.8W + T}\right)$$

wherein, with reference to FIG. 3, $E_R$ is the dielectric constant of the insulating substrate and is equal to 4.5; H is the dielectric thickness, i.e., the thicknesses of the first and fifth insulating substrates (D1), (D5); W=6 mil, which is the width of traces of the signal wiring layers; and T=1.4 mil, which is the thickness of the traces of the signal wiring layers.

Formula II (for obtaining the values of resistances (Rs2) and (Rs3))

$$Zo2 = \frac{\left[1 - \left(\frac{A}{4(A + D + T)}\right)\right]}{\sqrt{E_R}} \ln\left(\frac{1.9(2A + T)}{0.8W + T}\right)$$

wherein, with reference to FIG. 4, $E_R$ is the dielectric constant of the insulating substrate and is equal to 4.5; A is the thicknesses of the second and fourth insulating substrates (D2), (D4); D is the thickness of the third insulating substrate (D3); W=6 mil, which is the width of traces of the signal wiring layers; and T=1.4 mil, which is the thickness of the traces of the signal wiring layers.

Since the values of Zo1 and Zo2 should fall within the range of 49.5Ω to 60.5Ω in order to meet design requirements, Zo1=49.5Ω and Zo1=60.5Ω are substituted into Formula I to obtain the value of H, which is within a certain range. Referring to FIG. 2, it is known that the respective thicknesses of the wiring layers (S1), (S2), (S3), (S4), (GND), (PWR) are 0.7 mil, 1.4 mil, 1.4 mil, 1.4 mil, 1.4 mil and 0.7 mil. Thus, the total thickness of the wiring layers is 7 mil. Since the thickness of the circuit board is 1.2 mm, which is equivalent to 47 mil, the total thickness of the insulating substrates (D1), (D2), (D3), (D4), (D5) is:

2H+2A+D=47 mil−7 mil=40 mil

2A+D=40 mil−2H                    (Formula III)

Values of A and D are then substituted into Formulas II and III to calculate a value of Zo2. The difference between the values of Zo1 and Zo2 is detected, and it is determined whether the values Zo1 and Zo2 fall within the 55±10%Ω range (49.5Ω to 60.5Ω). If not, the values of H, A and D are adjusted to calculate and obtain another value for each of Zo1 and Zo2. By repeating this process in a trial-and-error fashion to adjust the values of H, A and D, the least difference between the values of Zo1 and Zo2 can be found, with both of the values of Zo1 and Zo2 falling within the 55±10%Ω range (49.5Ω to 60.5Ω) The values of H, A and D are therefore determined such that 2H+2A+D+7 mil (total thickness of the wiring layers) equals 1.2 mm (thickness of the circuit board).

Based on the above calculation and by subsequent testing, the following optimum values are obtained. It is found that when H=4.5 mil, A=6 mil and D=16 mil, Zo1=55Ω and Zo2=56Ω, both of which fall within the preferable range of 55±10%Ω (49.5Ω to 60.5Ω). Besides, 2H+2A+D+7 mil (total thickness of the wiring layers)=47 mil (i.e. 1.2 mm, total thickness of the circuit board). Since the difference between (Rs1) or (Rs4) and between (Rs2) or (Rs3) is relatively small, impedance is matched.

By virtue of the construction of the preferred embodiment, the following effects can be achieved:

(1) Reduced reflection during high speed signal transmission: Due to impedance matching, the amount of reflection (standing waves) can be considerably reduced. Besides, since the value of resistance between adjacent wiring layers complies with the standard theoretical value of 55±10%Ω recommended by Intel, the quality of signals is vastly improved.

(2) Enhanced magnetic flux counteraction: Since the amount of signal reflection is reduced, electromagnetic interference is correspondingly lowered.

(3) During the process of layout, since the resistances Zo1, Zo2 are substantially equal, resistance control can be achieved without the need to alter the width of the traces of the wiring layers.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

I claim:

1. A multi-layer circuit board comprising:

first, second, third, fourth and fifth insulating substrates disposed sequentially one above the other;

a first signal wiring layer disposed on one side of said first insulating substrate opposite to said second insulating substrate;

a ground wiring layer disposed between said first and second insulating substrates;

a second signal wiring layer disposed between said second and third insulating substrates;

a third signal wiring layer disposed between said third and fourth insulating substrates;

a power wiring layer disposed between said fourth and fifth insulating substrates; and a fourth signal wiring layer disposed on one side of said fifth insulating substrate opposite to said fourth insulating substrate;

wherein said first, second, third, fourth and fifth insulating substrates, said first, second, third and fourth signal wiring layers, said ground wiring layer and said power wiring layer are press-bonded to each other to form said circuit board with a thickness of about 1.2 mm;

wherein each of said first and fifth insulating substrates has a thickness ranging from 4.175 to 4.725 mil;

wherein each of said second and fourth insulating substrates has a thickness ranging from 5.7 to 6.3 mil;

wherein said third insulating substrate has a thickness ranging from 15.2 to 16.8 mil;

wherein said first signal wiring layer has a first resistance with respect to said ground wiring layer, said second signal wiring layer having a second resistance with respect to said ground wiring layer and said power wiring layer, said third signal wiring layer having a third resistance with respect to said ground wiring layer and said power wiring layer, said fourth signal wiring layer having a fourth resistance with respect to said power wiring layer; and wherein said first, second, third and fourth resistances are within the range of 49.5 to 60.5 ohms.

2. The multi-layer circuit board of claim 1, wherein at least one of said first, third and fifth insulating substrates is made from a polyester prepreg.

3. The multi-layer circuit board of claim 1, wherein at least one of said second and fourth insulating substrates is made from a fibrous core material.

4. The multi-layer circuit board of claim 3, wherein the core material contains paper fibers.

5. The multi-layer circuit board of claim 3, wherein the core material contains glass fibers.

6. The multi-layer circuit board of claim 1, wherein the thickness of each of said first and fifth insulating substrates is equal to 4.5 mil.

7. The multi-layer circuit board of claim 1, wherein the thickness of each of said second and fourth insulating substrates is equal to 6 mil.

8. The multi-layer circuit board of claim 1, wherein the thickness of said third insulating substrate is equal to 16 mil.

9. The multi-layer circuit board of claim 1, wherein:

each of said first and fourth signal wiring layers has a thickness of about 0.7 mil; and each of said second and third signal wiring layers, said ground wiring layer and said power wiring layer has a thickness of about 1.4 mil.

10. The multi-layer circuit board of claim 1, wherein the first and fourth resistances are substantially equal.

* * * * *